United States Patent
Wu et al.

(10) Patent No.: US 9,659,864 B2
(45) Date of Patent: May 23, 2017

(54) METHOD AND APPARATUS FOR FORMING SELF-ALIGNED VIA WITH SELECTIVELY DEPOSITED ETCHING STOP LAYER

(71) Applicant: TAIWAN SEMICONDUCTOR MANUFACTURING COMPANY, LTD., Hsin-Chu (TW)

(72) Inventors: Yung-Hsu Wu, Taipei (TW);
Hai-Ching Chen, Hsinchu (TW);
Jung-Hsun Tsai, Taoyuan (TW);
Shau-Lin Shue, Hsinchu (TW); Tien-I Bao, Dayuan Township (TW)

(73) Assignee: TAIWAN SEMICONDUCTOR MANUFACTURING COMPANY, LTD., Hsin-Chu, TX (US)

( * ) Notice: Subject to any disclaimer, the term of this patent is extended or adjusted under 35 U.S.C. 154(b) by 0 days.

(21) Appl. No.: 14/887,396

(22) Filed: Oct. 20, 2015

(65) Prior Publication Data
US 2017/0110397 A1    Apr. 20, 2017

(51) Int. Cl.
*H01L 23/532* (2006.01)
*H01L 23/528* (2006.01)
*H01L 23/522* (2006.01)
*H01L 21/768* (2006.01)
*H01L 21/02* (2006.01)
*H01L 21/033* (2006.01)
*H01L 21/311* (2006.01)

(52) U.S. Cl.
CPC ........ *H01L 23/528* (2013.01); *H01L 21/0214* (2013.01); *H01L 21/0228* (2013.01); *H01L 21/02126* (2013.01); *H01L 21/02282* (2013.01); *H01L 21/02348* (2013.01); *H01L 21/0337* (2013.01); *H01L 21/31144* (2013.01); *H01L 21/76802* (2013.01); *H01L 21/76877* (2013.01); *H01L 23/5226* (2013.01); *H01L 23/532* (2013.01)

(58) Field of Classification Search
CPC .......... H01L 29/7827; H01L 21/02532; H01L 21/31111; H01L 21/76802; H01L 21/76877; H01L 21/76897; H01L 21/84; H01L 27/1203; H01L 29/0649; H01L 29/41766; H01L 29/6656; H01L 29/66666
See application file for complete search history.

(56) References Cited

U.S. PATENT DOCUMENTS

| 7,667,271 | B2 | 2/2010 | Yu et al. |
| 7,910,453 | B2 | 3/2011 | Xu et al. |
| 8,377,779 | B1 | 2/2013 | Wang |
| 8,399,931 | B2 | 3/2013 | Liaw et al. |

(Continued)

*Primary Examiner* — Roy Potter
(74) *Attorney, Agent, or Firm* — Haynes and Boone, LLP

(57) ABSTRACT

A layer of an interconnect structure is formed over a substrate. The layer contains an interlayer dielectric (ILD) material and a metal line disposed in the ILD. A first etching stop layer is formed on the ILD but not on the metal line. The first etching stop layer is formed through a selective atomic layer deposition (ALD) process. A second etching stop layer is formed over the first etching stop layer. A high etching selectivity exists between the first and second etching stop layers. A via is formed to be at least partially aligned with, and electrically coupled to, the metal line. The first etching stop layer prevents the ILD from being etched through during the formation of the via.

20 Claims, 15 Drawing Sheets

(56) References Cited

U.S. PATENT DOCUMENTS

| | | | |
|---|---|---|---|
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 2014/0001574 A1 | 1/2014 | Chen et al. | |
| 2014/0110755 A1 | 4/2014 | Colinge | |
| 2014/0151812 A1 | 6/2014 | Liaw | |
| 2015/0162280 A1* | 6/2015 | Pan | H01L 21/7684 257/774 |

\* cited by examiner

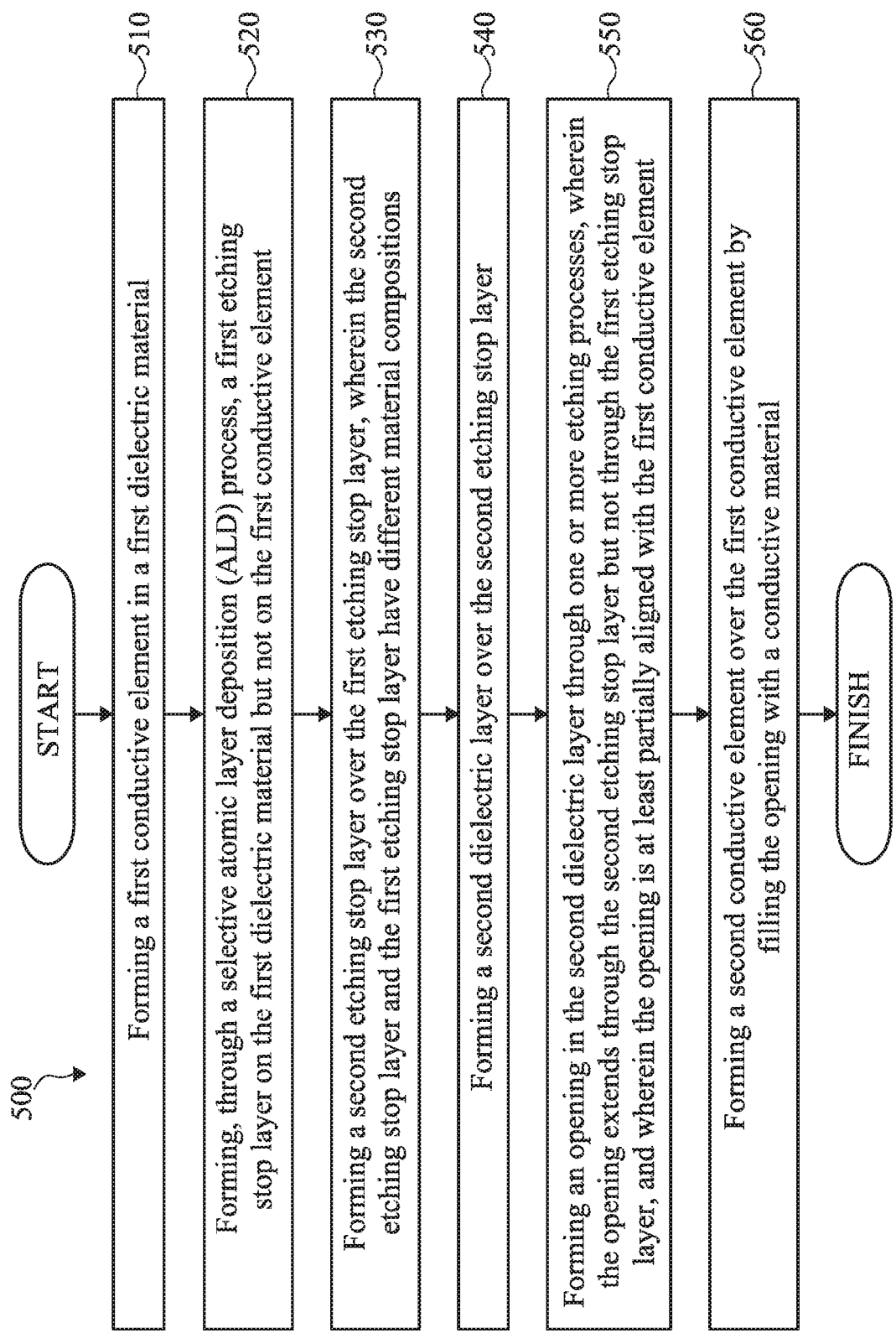

METHOD AND APPARATUS FOR FORMING SELF-ALIGNED VIA WITH SELECTIVELY DEPOSITED ETCHING STOP LAYER

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

As a part of the semiconductor fabrication, conductive elements may be formed to provide electrical interconnections for the various components for an IC. For example, conductive vias for interconnecting different metal layers may be formed by etching openings in an interlayer dielectric (ILD) and filling the openings with a conductive material. However, as semiconductor fabrication technology nodes continue to evolve, critical dimensions and pitches are becoming smaller and smaller, and the process windows are becoming tighter. Consequently, overlay errors (e.g., misaligned via) may occur, which may lead to problems such as reduced reliability test margin or poor device performance.

Therefore, while conventional via formation processes have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 15 is a flowchart illustrating a method of fabricating a semiconductor device in accordance with some embodiments of the present disclosure.

DETAILED DESCRIPTION

Figure 1:
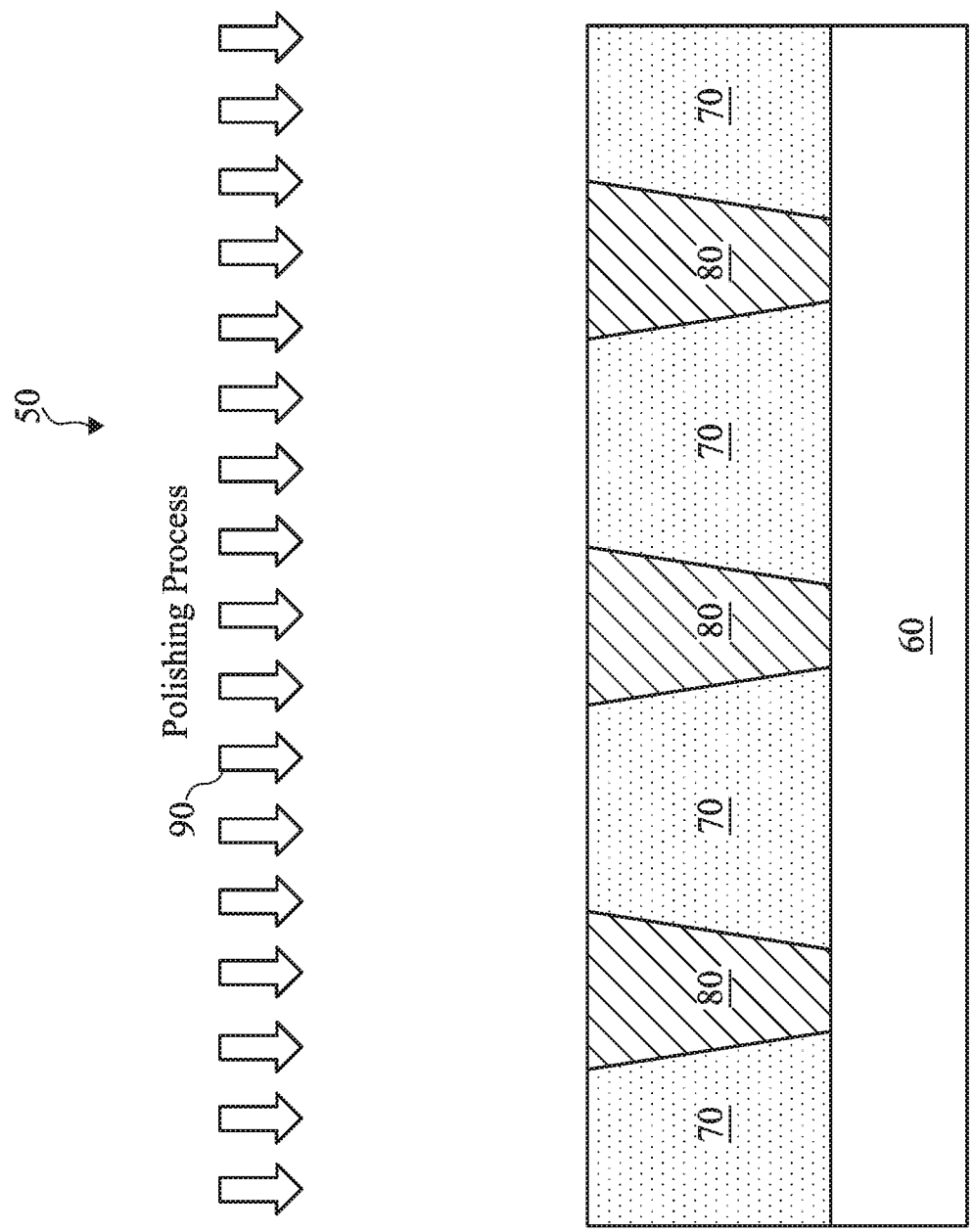
FIGS. 1-14 are diagrammatic cross-sectional side views of a semiconductor device at various stages of fabrication in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As a part of semiconductor fabrication, electrical interconnections need to be formed to electrically interconnect the various microelectronic elements (e.g., source/drain, gate, etc.) of the semiconductor device. Generally, this involves forming openings in layers (such as in electrically insulating layers), and subsequently filling these openings with an electrically conductive material. The electrically conductive material is then polished to form the electrical interconnections such as metal lines or vias.

However, as semiconductor technology generations continue the scaling-down process, accurate alignment or overlay may become problematic due to the ever-decreasing trench sizes. For example, it may be more difficult for vias to be accurately aligned with the desired metal lines above or below. When via misalignment or overlay problems occur, conventional methods of fabrication may lead to undesirable over-etching of a dielectric material (e.g., ILD) below the via opening. When the via opening is later filled with a metal material, its shapes resembles a tiger tooth. Such "tiger tooth" vias may lead to poor device performance. Tighter process windows may need to be used to avoid these problems, but that may degrade device performance as well.

To improve via alignment and to avoid over-etching of the ILD during the via formation, the present disclosure proposes a novel method and structure utilizing selective deposition of an etching stop layer to enlarge the process window without sacrificing performance. The various aspects of the present disclosure will now be discussed in more detail with reference to FIGS. 1-15.

FIGS. 1-4 are diagrammatic fragmentary cross-sectional side views of a semiconductor device 50 at various stages of fabrication in accordance with various aspects of the present disclosure. The semiconductor device 50 is fabricated under a semiconductor technology node that is 5-nanometers or lower. The semiconductor device 50 may include an integrated circuit (IC) chip, system on chip (SoC), or portion thereof, and may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors.

The semiconductor device 50 includes a substrate 60. In some embodiments, the substrate 60 is a silicon substrate doped with a p-type dopant such as boron (for example a p-type substrate). Alternatively, the substrate 60 could be another suitable semiconductor material. For example, the substrate 60 may be a silicon substrate that is doped with an n-type dopant such as phosphorous or arsenic (an n-type substrate). The substrate 60 could include other elementary semiconductors such as germanium and diamond. The substrate 60 could optionally include a compound semiconductor and/or an alloy semiconductor. Further, the substrate 60 could include an epitaxial layer (epi layer), may be strained for performance enhancement, and may include a silicon-on-insulator (SOI) structure.

In some embodiments, the substrate 60 is substantially conductive or semi-conductive. The electrical resistance may be less than about $10^3$ ohm-meter. In some embodiments, the substrate 60 contains metal, metal alloy, or metal nitride/sulfide/selenide/oxide/silicide with the formula MXa, where M is a metal, and X is N, S, Se, O, Si, and where "a" is in a range from about 0.4 to 2.5. For example, the substrate 60 may contain Ti, Al, Co, Ru, TiN, WN2, or TaN.

In some other embodiments, the substrate 60 contains a dielectric material with a dielectric constant in a range from about 1 to about 40. In some other embodiments, the substrate 60 contains Si, metal oxide, or metal nitride, where the formula is MXb, wherein M is a metal or Si, and X is N or O, and wherein "b" is in a range from about 0.4 to 2.5. For example, the substrate 60 may contain $SiO_2$, silicon nitride, aluminum oxide, hafnium oxide, or lanthanum oxide.

It is understood that a plurality of drains/sources may be formed in the substrate 60, and a plurality of gates may be formed over the substrate 60. For reasons of simplicity, however, these drains/sources or gates are not specifically illustrated herein.

A dielectric layer 70 is formed over the substrate 60. The dielectric layer 70 may be formed using a deposition process. In various embodiments, the dielectric layer 70 may contain a low-k dielectric material. A low-k dielectric material may refer to a dielectric material having a dielectric constant lower than the dielectric constant of silicon dioxide, which is about 3.9. As non-limiting examples, the low-k dielectric material may include fluorine-doped silicon dioxide, carbon-doped silicon dioxide, porous silicon dioxide, porous carbon-doped silicon dioxide, spin-on organic polymeric dielectric materials, or spin-on silicon based polymeric dielectric materials.

A plurality of conductive elements 80 are formed in the dielectric layer 70. The conductive elements 80 are also referred to as metal lines of a $M_X$ interconnect layer of a multilayered interconnect structure. The conductive elements 80 are formed by etching openings in the dielectric layer 70 and filling the openings with a conductive material. In some embodiments, the conductive material may contain copper or aluminum. A polishing process (such as chemical mechanical polishing) 90 is performed to polish the upper surfaces of the dielectric material 70 and the conductive elements 80.

Figure 2:
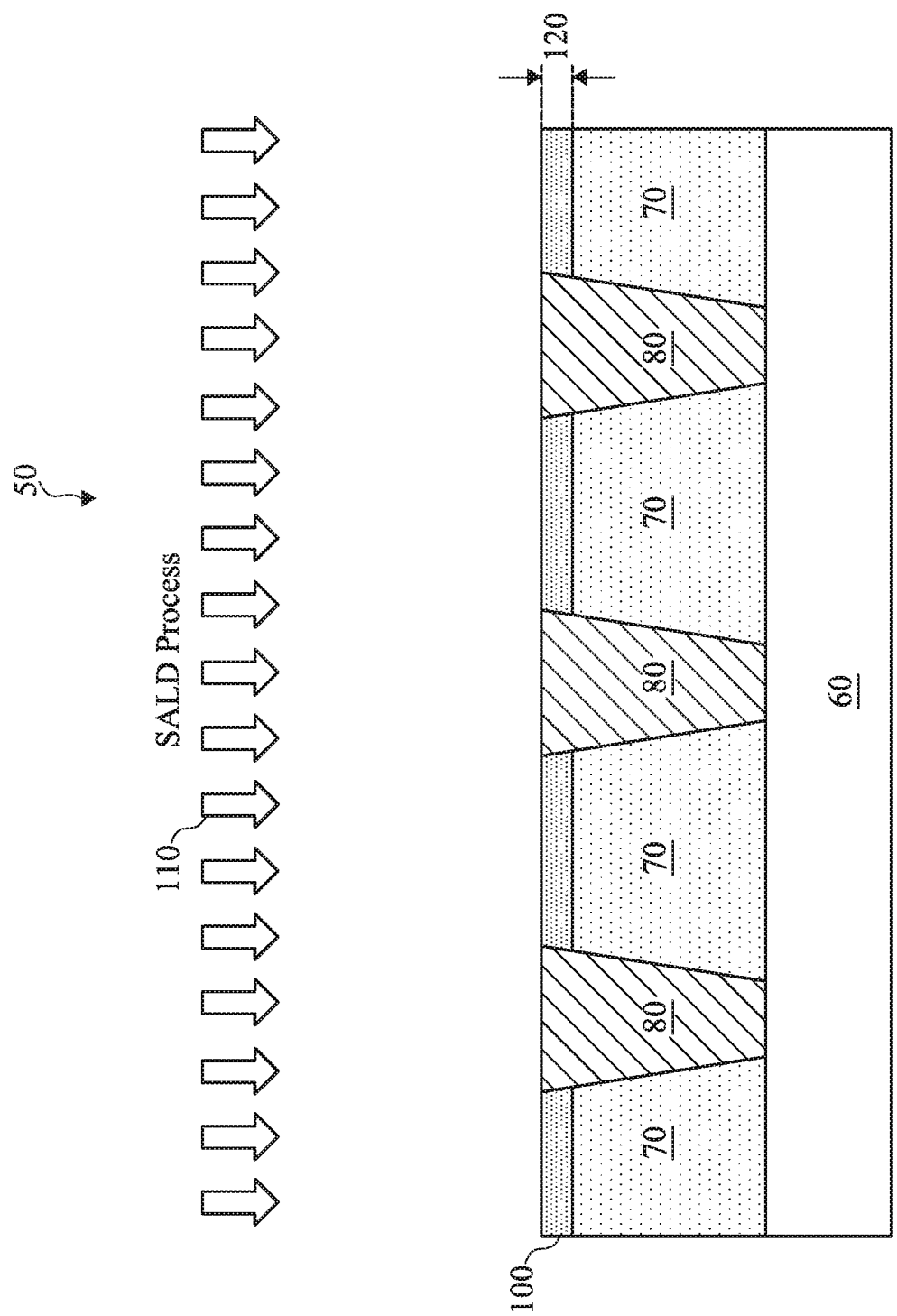

Referring now to FIG. 2, an etching stop layer 100 (also referred to as etching-stop layer or etch stop layer) is formed over the upper surfaces of dielectric layer 70, but not on the conductive elements 80. The etching stop layer 100 is formed to contain metal oxide. The etching stop layer is formed via a selective atomic layer deposition (SALD) process 110. In the SALD process 110, alternating cycles are performed. In one cycle, a precursor gas is turned on. In another cycle, an oxidant gas is turned on. These cycles are repeated for a number of times, which can be precisely controlled to grow a desired material of a desired thickness.

The process conditions of the SALD process 110 are as follows:

In one embodiment, the precursor gas includes Tetrakis-ethylmethylaminohafnium (TEMAHf):

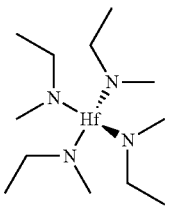

In this embodiment, the process temperature is in a range from about 200 degrees Celsius to about 400 degrees Celsius. The vapor pressure is about 0.1 torr at 70 degrees Celsius. The oxidant gas may contain $H_2O$, $(H_2+O_2)$, or $O_3$. As a result, hafnium oxide is formed as the material for the etching stop layer 100. The dielectric constant value of the etching stop layer 100 is about 18.5, its associated leakage current is about $4\times10^{-12}$ amps, and its associated electric breakdown strength (EBD) is about 7.4 millivolts per centimeter.

In another embodiment, the precursor gas includes tetrakis(ethylmethylamido)zirconium (TEMA-Zr):

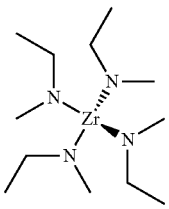

In this embodiment, the process temperature is in a range from about 200 degrees Celsius to about 400 degrees Celsius. The vapor pressure is about 0.1 torr at 70 degrees Celsius. The oxidant gas may contain $H_2O$, $(H_2+O_2)$, or $O_3$. As a result, zirconium oxide is formed as the material for the etching stop layer 100. The dielectric constant value of the etching stop layer 100 is about 20, its associated leakage current is about $1\times10^{-12}$ amps, and its associated electric breakdown strength (EBD) is about 5.6 millivolts per centimeter.

In yet another embodiment, the precursor gas includes Trimethyl Aluminum (TMA):

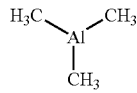

In this embodiment, the process temperature is in a range from about 200 degrees Celsius to about 400 degrees Celsius. The vapor pressure is about 100 torr at 70 degrees Celsius. The oxidant gas may contain $H_2O$, $(H_2+O_2)$, or $O_3$. As a result, aluminum oxide is formed as the material for the etching stop layer 100. The dielectric constant value of the etching stop layer 100 is about 8.2, its associated leakage current is less than about $1\times10^{-12}$ amps, and its associated electric breakdown strength (EBD) is about 8.2 millivolts per centimeter.

In yet another embodiment, the precursor gas includes Tetrakis(dimethylamido) Aluminum (TDMAA):

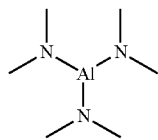

In this embodiment, the process temperature is in a range from about 200 degrees Celsius to about 400 degrees Celsius. The vapor pressure is about 0.2 torr at 70 degrees Celsius. The oxidant gas may contain $H_2O$, $(H_2+O_2)$, or $O_3$. As a result, aluminum oxide is formed as the material for the etching stop layer 100. The dielectric constant value of the etching stop layer 100 is about 8.2, its associated leakage current is less than about $1\times10^{-12}$ amps, and its associated electric breakdown strength (EBD) is about 8.2 millivolts per centimeter.

As is illustrated in FIG. 2, the etching stop layer 100 is formed to have a relatively co-planar surface (i.e., within a few angstroms or less) with the conductive elements 80. This may be accomplished in one of two ways. In one embodiment, the polishing process 90 (shown in FIG. 1) may be configured such that the dielectric material 70 has a lower upper surface than the conductive elements 80. In other words, the dielectric material 70 may be "over-polished" to form "recesses". The etching stop layer 100 may then be formed to fill these "recesses" by the SALD process 110 so as to be relatively co-planar with the conductive elements 80. In another embodiment, the dielectric material 70 is removed in an etching process to form the "recesses", which are then filled by the etching stop layer 100 by the SALD process 110.

The etching stop layer 100 is formed to have a thickness 120. In some embodiments, the thickness 120 is in a range from about 2 nanometers to about 5 nanometers. The thickness range is selected because if it is too thin, then the etching stop layer 100 may not be able to adequately serve the etching stop function in a later process (discussed below in more detail). On the other hand, if the thickness 120 is too thick, the selective growth (i.e., growing on the surface of the dielectric material 70 but not on the surface of the conductive elements 80) may be difficult to control, and it is possible that some portions of the etching stop layer 100 may "spill over" to the surfaces of the conductive elements 80. Thus, the thickness range of 2-5 nanometers represents an optimum thickness range for the etching stop layer 100.

Figure 3:
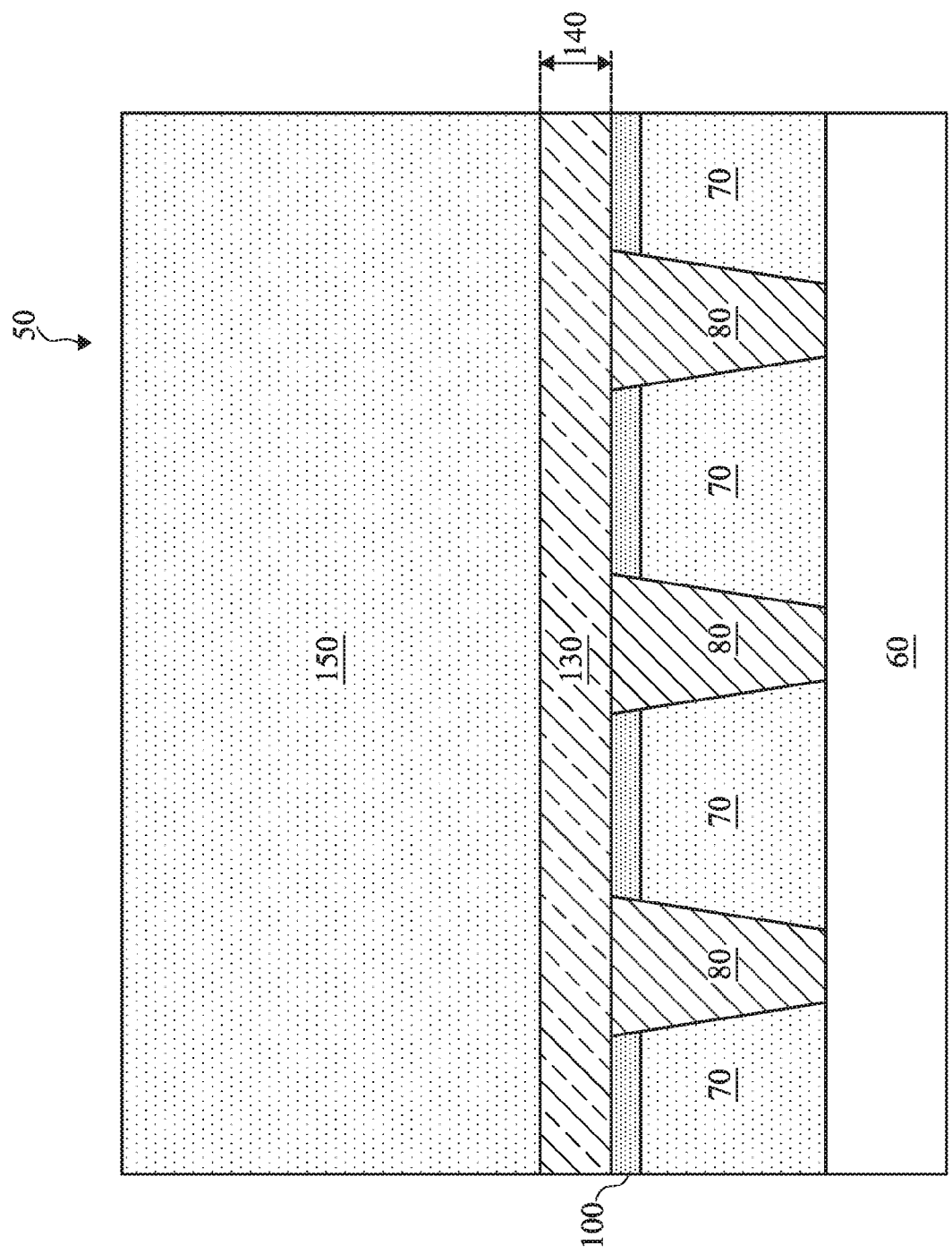

Referring now to FIG. 3, another etching stop layer 130 is formed over the etching stop layer 100 and over the conductive elements 80. The etching stop layer 130 has a different material composition than the etching stop layer 100. The etching stop layer 130 may be formed by a chemical vapor deposition (CVD) process. In some embodiments, the etching stop layer 130 contains silicon oxycarbide (SiOC) or silicon oxynitride (SiON). The etching stop layer 130 also is formed with a thickness 140. The thickness 140 is in a range from about 2 nanometers to about 8 nanometers in some embodiments. In some embodiments, the thickness 140 is in a range from about 30 nanometers to about 60 nanometers. The thickness 140 is tuned so that the etching stop layer 130 can adequately serve its purpose as an etching-stop layer in a later etching process discussed below.

Still referring to FIG. 3, a dielectric material 150 is formed over the etching stop layer 130. The dielectric material 150 may have a similar material composition to the dielectric material 70. For example, the dielectric material 150 may also contain a low-k dielectric material discussed above. Both the dielectric material 70 and the dielectric material 150 may also be referred to as interlayer dielectric (ILD) of an interconnect structure.

Figure 4:
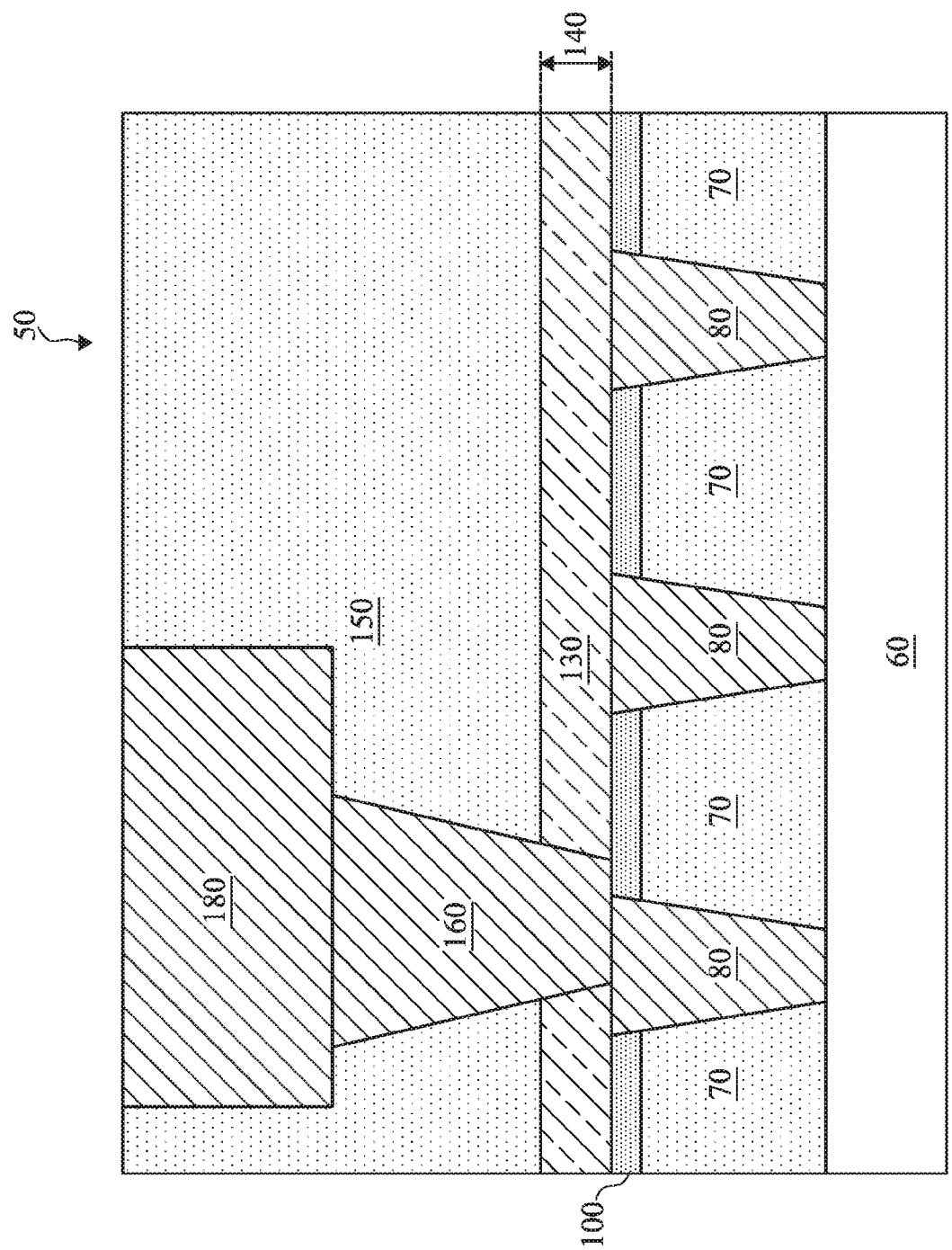

Referring now to FIG. 4, a via 160 and a conductive element 180 are formed in the dielectric material 150. The conductive element 180 is also referred to as a metal line of a $M_{X+1}$ interconnect layer of the multilayered interconnect structure (the via 160 may or may not be considered to be a part of the $M_{X+1}$ interconnect layer). As is shown in FIG. 4, the conductive element 180 is formed above (and comes into direct physical contact with) the via 160. The via 160 is at least partially aligned with the conductive element 80. As is shown in FIG. 4, the via 160 is formed to extend through the etching stop layer 130 and comes into direct physical contact with one of the conductive element 80. In this manner, the via 160 electrically interconnects together the conductive elements 80 and 180. Stated differently, the via 160 electrically interconnects together the metal lines of the $M_X$ interconnect layer and the $M_{X+1}$ interconnect layer.

In some embodiments, the via 160 and the conductive element 180 are formed using a dual damascene process. In other embodiments, the via 160 and the conductive element 180 are formed using a single damascene process. Regardless, the damascene process used to form the via 160 includes etching processes. For example, in a first etching process, a recess or opening is etched in the dielectric material 150, while the etching stop layer 130 serves as an etching stop layer herein to prevent the layers therebelow from being etched. C4F8, CF4, N2, Ar may be used as etchants. Thereafter, the etching stop layer 130 itself is "opened" in another etching process so as to extent the recess or opening down to the conductive element 80. C4F8, C4F6, CF4, or N2 may be used as etchants.

Conventionally, the etching stop layer 100 is not formed. Consequently, the etching process for opening the etching stop layer 130 may inadvertently "punch through" the etching stop layer 130 and cause portions of the dielectric material 70 therebelow to also be etched. Thereafter, when the etched recess or opening is filled with a conductive material to form the via 160, a portion of the via 160 would extend into the dielectric material 70, resembling a "tiger tooth." This tiger tooth effect is exacerbated as the misalignment between the via 160 and the conductive element 80 worsens. As a result, device performance such as reliability (e.g., measured by time-dependent dielectric breakdown, or TDDB) may suffer, and/or excessive contact resistance problems may arise from gap fill void.

The present disclosure prevents the over-etching of the dielectric material 70 by forming the etching stop layer 100. The material composition of the etching stop layer 100 is configured to have a high etching selectivity (e.g., greater than 1:100) with respect to the etching stop layer 130 during the etching process to "open" the etching stop layer 130. In this manner, while the etching stop layer 130 is "opened", little to no portion of the etching stop layer 100 is removed. Hence, even if there is misalignment between the via 160 and the conductive element 80, no portion of the via 160 would punch through the dielectric material 70 (because it is stopped by the etching stop layer 100) to form the "tiger tooth" discussed above. Stated differently, the portion of the via 160 that is offset from the conductive element 80 is formed on the etching stop layer 100 according to the present disclosure.

Since the "tiger tooth" via punch through is no longer a problem, the process windows for forming the via 160 can be relaxed, and the device performance may be improved as well. For example, since misalignment will likely not lead to the "tiger tooth"-like via punch through, the via 160 can be made to be bigger (e.g., wider lateral dimension) to ensure that there is physical contact between the via 160 and the conductive element 80. The greater via size may reduce contact resistance, in addition to relaxing gap filling windows in the damascene process.

FIGS. 5-9 are diagrammatic fragmentary cross-sectional side views of the semiconductor device 50 at various stages of fabrication in accordance with another embodiment of the present disclosure. For reasons of clarity and consistency, similar elements appearing in FIGS. 1-9 are labeled the same, and the details of these elements are not necessarily repeated again below.

Figure 5:
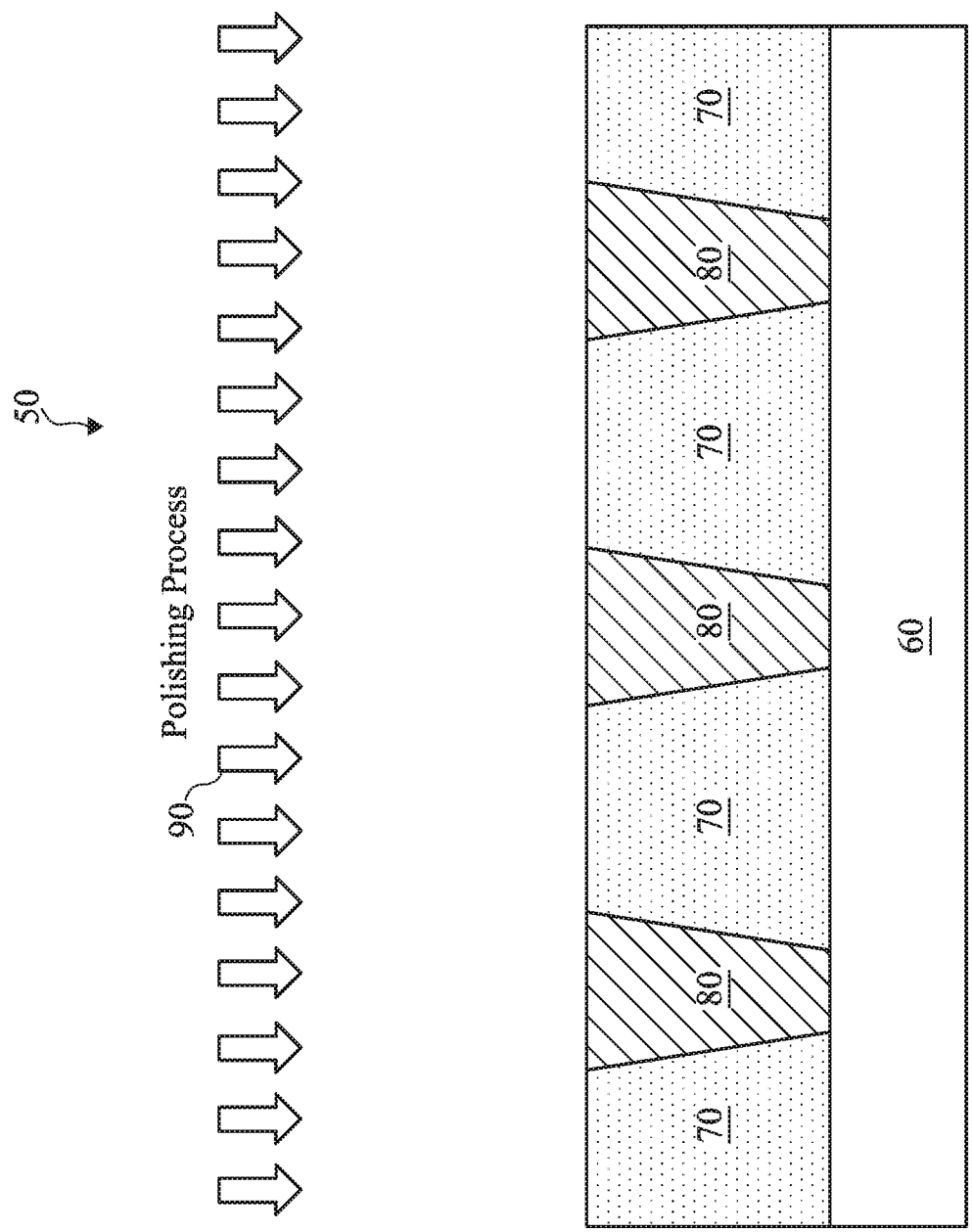

Referring to FIG. 5, a substrate 60 is provided. A $M_X$ interconnect layer including the dielectric material 70 and the conductive elements 80 is formed over the substrate 60. A polishing process 90 is performed to planarize the surface of the $M_X$ interconnect layer.

Figure 6:
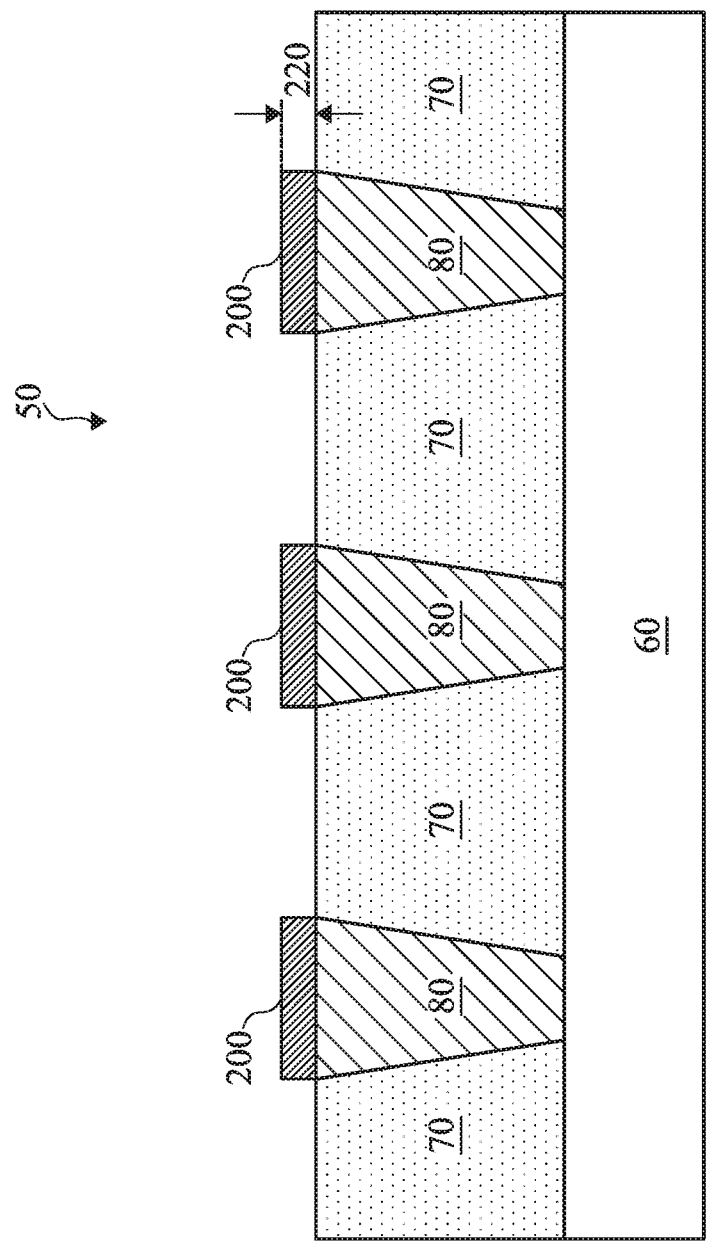

Referring now to FIG. 6, a plurality of metal capping layers 200 is formed. Each metal capping layer 200 is formed on the upper surface of a respective conductive element 80, but not on the surface of the dielectric material 70. In some embodiments, the metal capping layer 200 is formed by a selective CVD process. The metal capping layer 200 contains cobalt in the present embodiment but may contain other suitable metal materials in alternative embodiments. The metal capping layer 200 is formed to have a thickness 220. In some embodiments, the thickness 220 is in a range from about 2 nanometers to about 5 nanometers.

Figure 7:
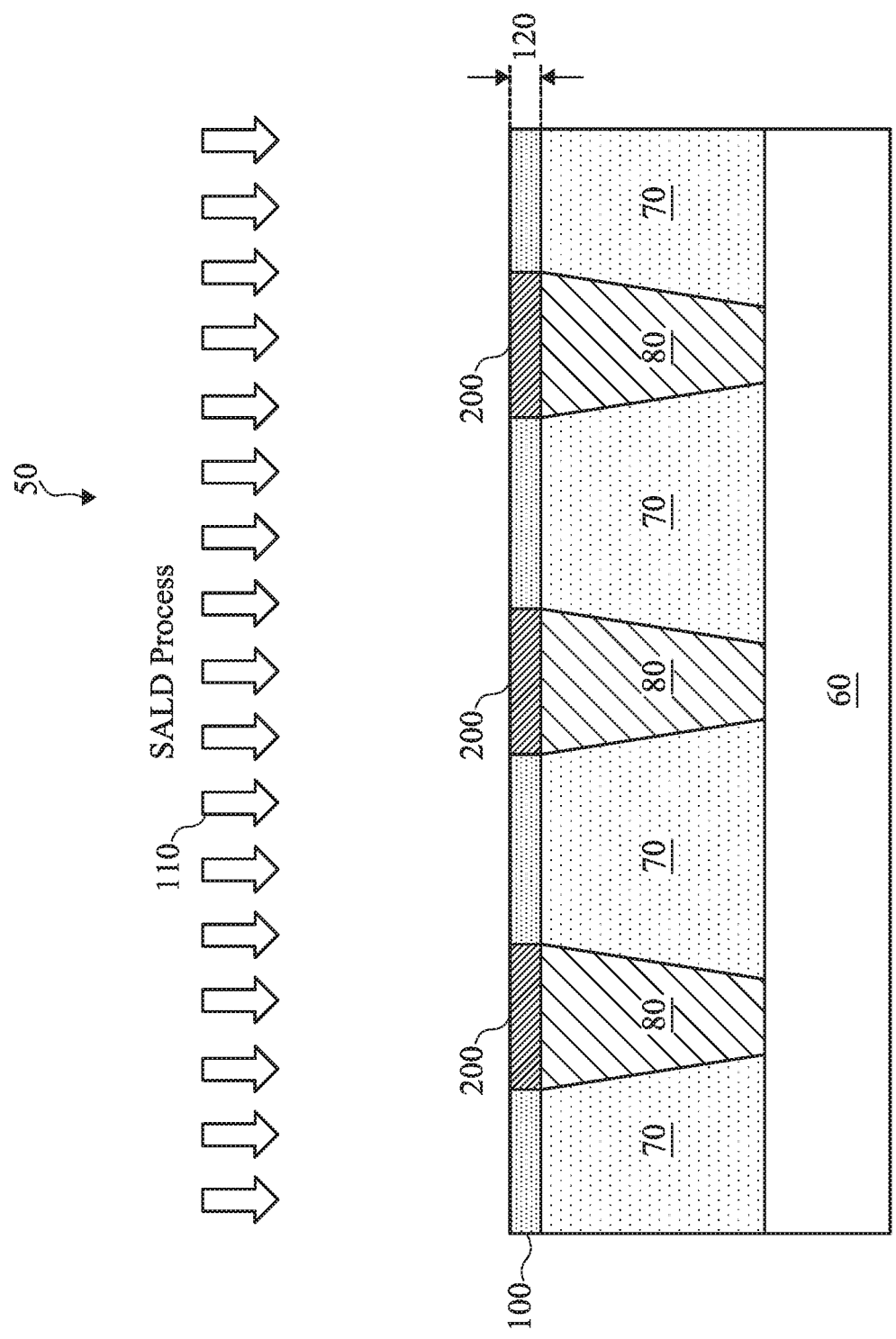

Referring now to FIG. 7, an etching stop layer 100 is formed via an SALD process 110. The details of the SALD process 110 are the same as that discussed above with reference to FIG. 2 and will not be repeated herein for reasons of simplicity. The SALD process 110 forms the etching stop layer 100 (containing a metal oxide material) on the surfaces of the dielectric material 70 but not on the surfaces of the metal capping layer 200. The etching stop layer 100 is also formed to have a thickness 120, which is about the same as the thickness 220 of the metal capping layer 200. In other words, the thickness 120 of the etching stop layer 100 is also in a range from about 2 nanometers to about 5 nanometers. As discussed above, the value of the thickness 120 is optimally configured so as to be not too thin or too thick, since the layer 100 may not adequately serve the etching stop function if it is formed too thin, and its selectively growth (not to be formed on the metal capping layer 200) may be too difficult to control if it is formed too thick.

Figure 8:
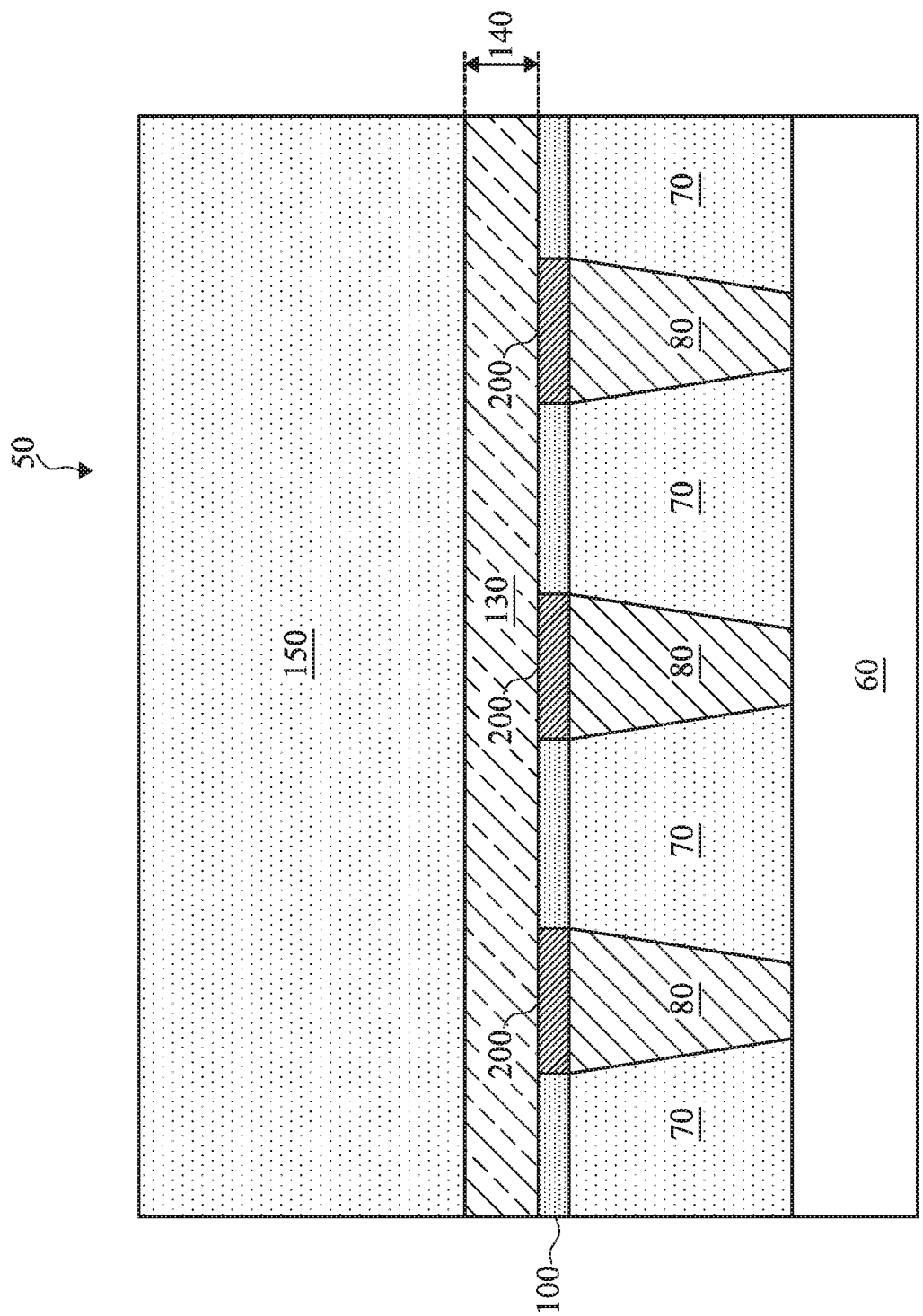

Referring now to FIG. 8, another etching stop layer 130 is formed over the etching stop layer 100 and over the metal capping layers 200. Again, the etching stop layer 130 has a different material composition than the etching stop layer 100. For example, the etching stop layer 130 may contain silicon oxycarbide (SiOC) or silicon oxynitride (SiON), while the etching stop layer 100 may contain hafnium oxide, zirconium oxide, or aluminum oxide. The etching stop layer 130 also is formed to be in a range from about 2 nanometers to about 8 nanometers. In some embodiments, a thickness 140 of the etching stop layer 130 is in a range from about 30 nanometers to about 60 nanometers, which allows the etching stop layer 200 to adequately serve its purpose as an etching-stop layer in a later etching process discussed below. As is shown in FIG. 8, a dielectric material 150 is also formed over the etching stop layer 130.

Figure 9:
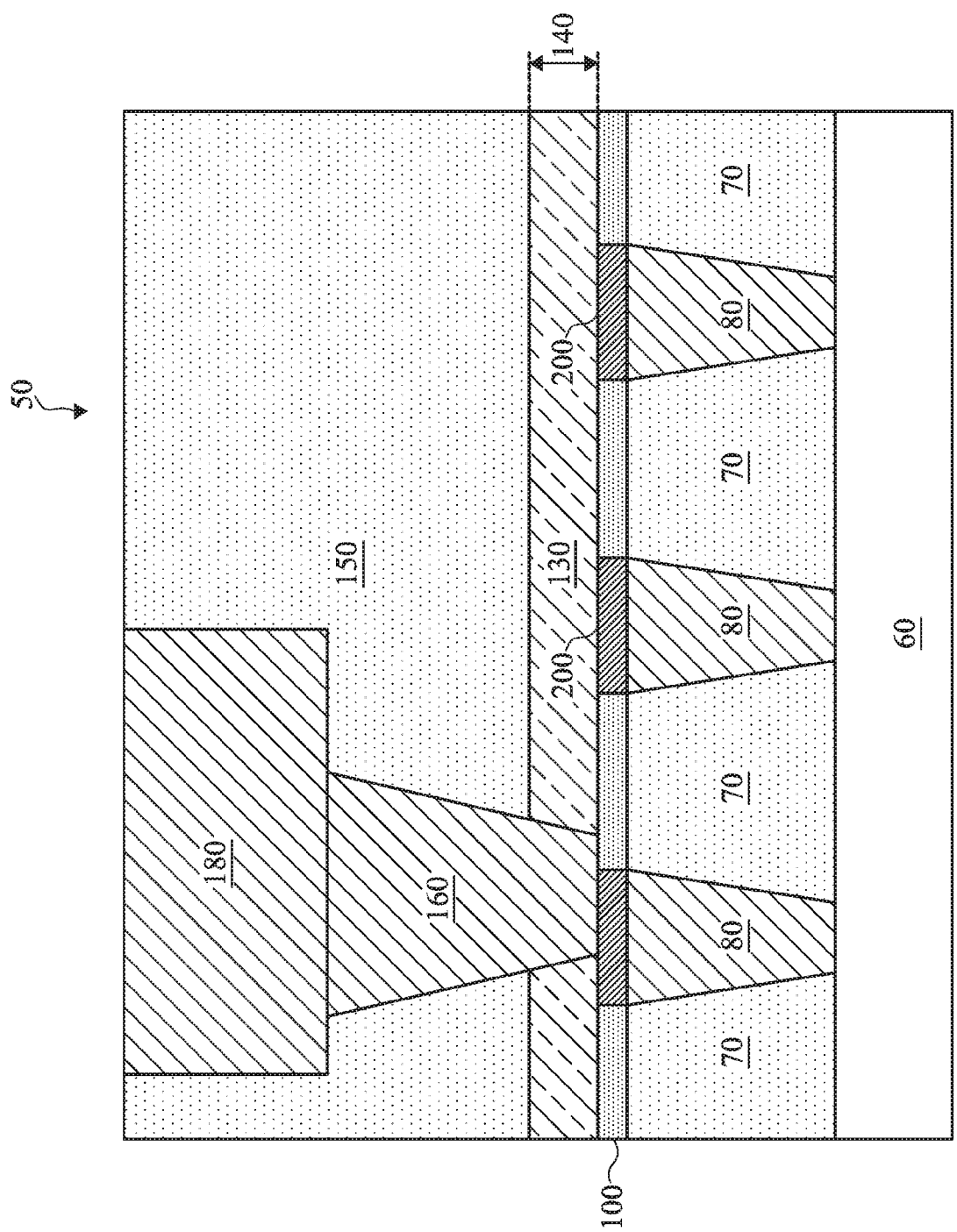

Referring now to FIG. 9, a via 160 and a conductive element 180 (of a $M_{X+1}$ interconnect layer) are formed in the dielectric material 150. The via 160 is at least partially aligned with the conductive element 80. The via 160 is also formed to extend through the etching stop layer 130 and comes into direct physical contact with one of the metal capping layers 200. Since the metal capping layer 200 is electrically conductive, the via 160 still electrically interconnects together the conductive elements 80 and 180. And regardless of how the via 160 is formed, the etching process used to form it by "opening" the etching stop layer 130 will be stopped by the etching stop layer 100. In other words, the dielectric material 70 will not be inadvertently "punched through" by the formation of the via 160. Thus, for reasons similar to those discussed above with reference to FIG. 4, the embodiment shown in FIG. 9 also avoids the "tiger tooth" problems and can offer better gap filling performance, relaxed process windows, and improved device performance.

FIGS. 10-14 are diagrammatic fragmentary cross-sectional side views of the semiconductor device 50 at various stages of fabrication in accordance with yet another embodiment of the present disclosure. For reasons of clarity and consistency, similar elements appearing in FIGS. 1-15 are labeled the same, and the details of these elements are not necessarily repeated again below.

Figure 10:
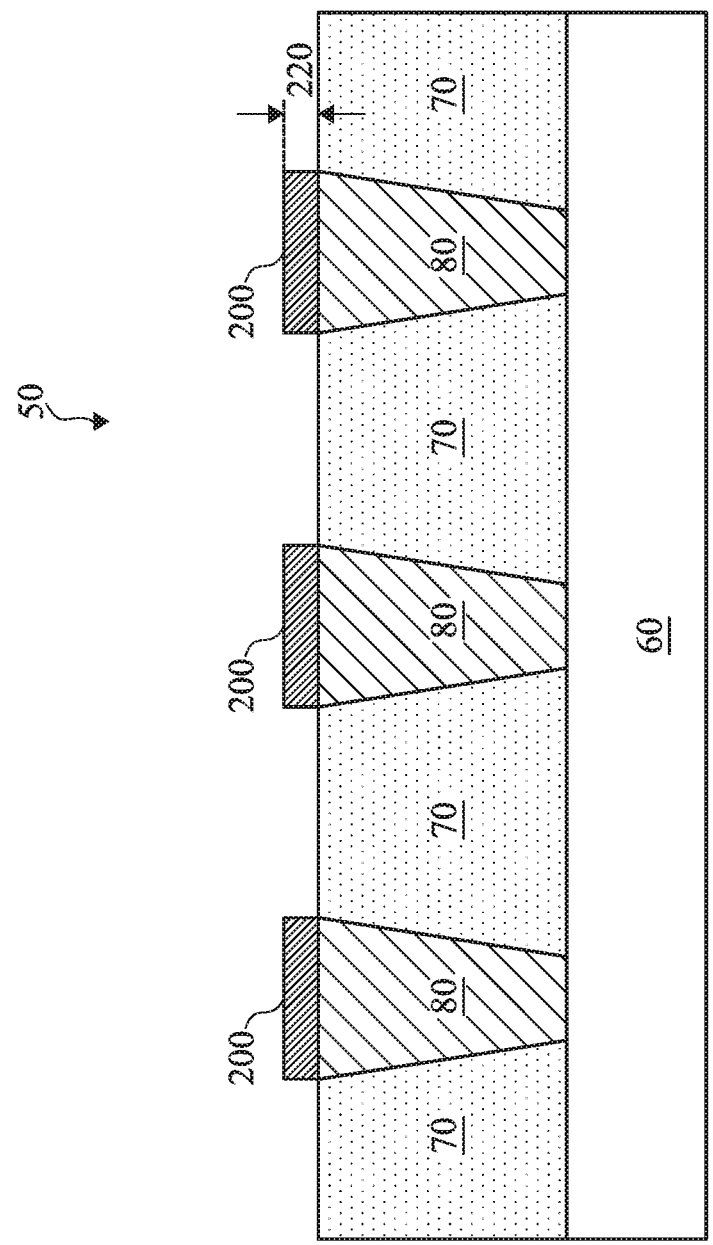

Referring to FIG. 10, a substrate 60 is provided. A $M_X$ interconnect layer including the dielectric material 70 and the conductive elements 80 are formed over the substrate 60. A polishing process is performed to planarize the surface of the $M_X$ interconnect layer. A plurality of metal capping layers 200 is formed (for example by a selective CVD process) on the upper surfaces of the conductive element 80, but not on the surface of the dielectric material 70. The metal capping layer 200 is formed to have a thickness 220, which may be in a range from about 2 nanometers to about 5 nanometers.

Figure 11:
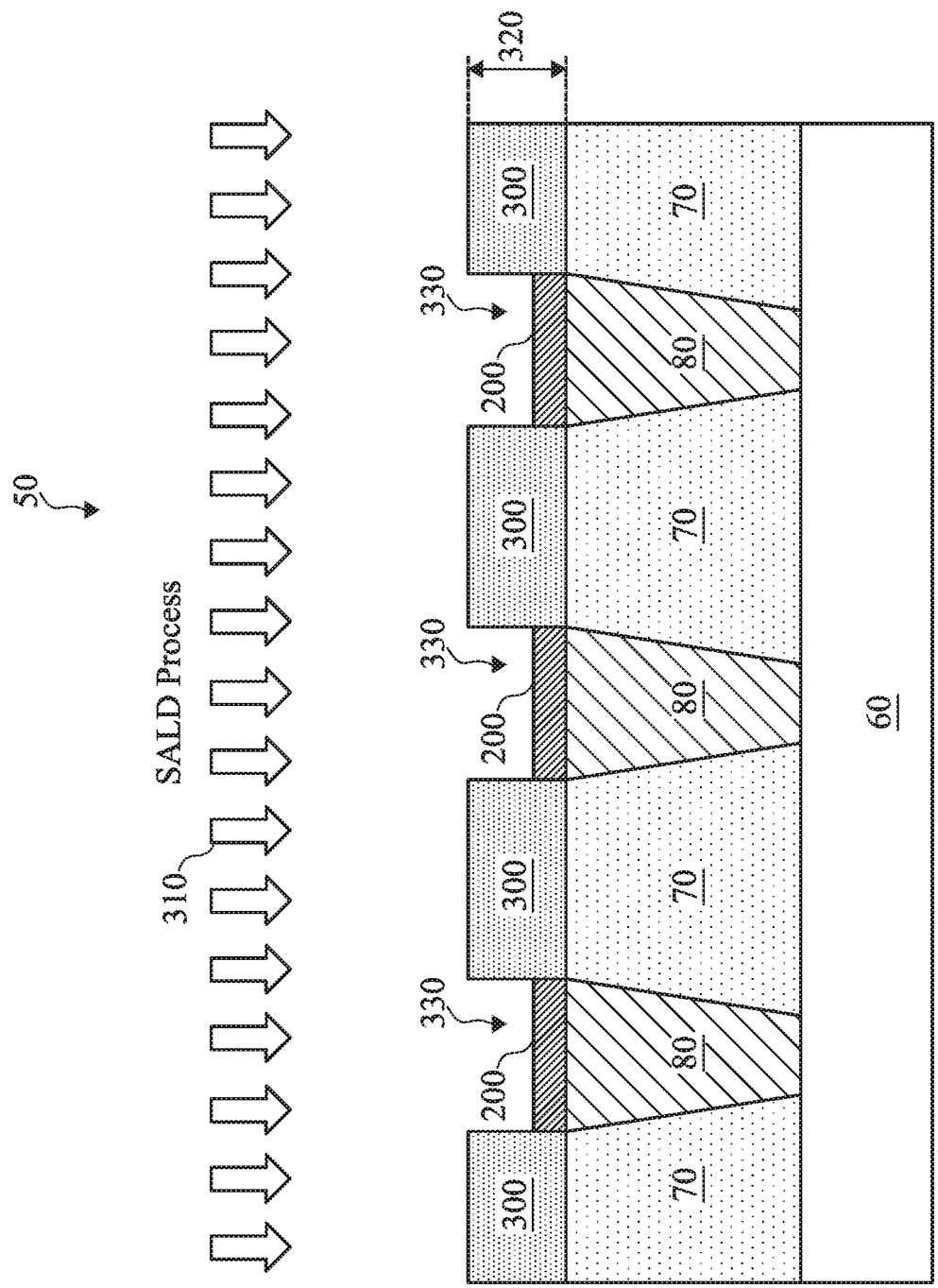

Referring now to FIG. 11, an etching stop layer 300 is formed via an SALD process 310. The details of the SALD process 310 are similar to the SALD process 110 discussed above with reference to FIG. 2. However, additional cycles may be performed to increase the thickness of the etching stop layer 300. In other words, the etching stop layer 300 (containing a metal oxide material) is still formed on the surfaces of the dielectric material 70 but not on the surfaces of the metal capping layer 200, but the etching stop layer 300 has a thickness 320, which is thicker than the thickness 220 of the metal capping layer 200. In some embodiments, the thickness 320 of the etching stop layer 300 is a range from about 6 nanometers to about 10 nanometers. Due to the increased thickness 300, recesses 330 are formed by the etching stop layer 300 and the metal capping layers 200.

Figure 12:
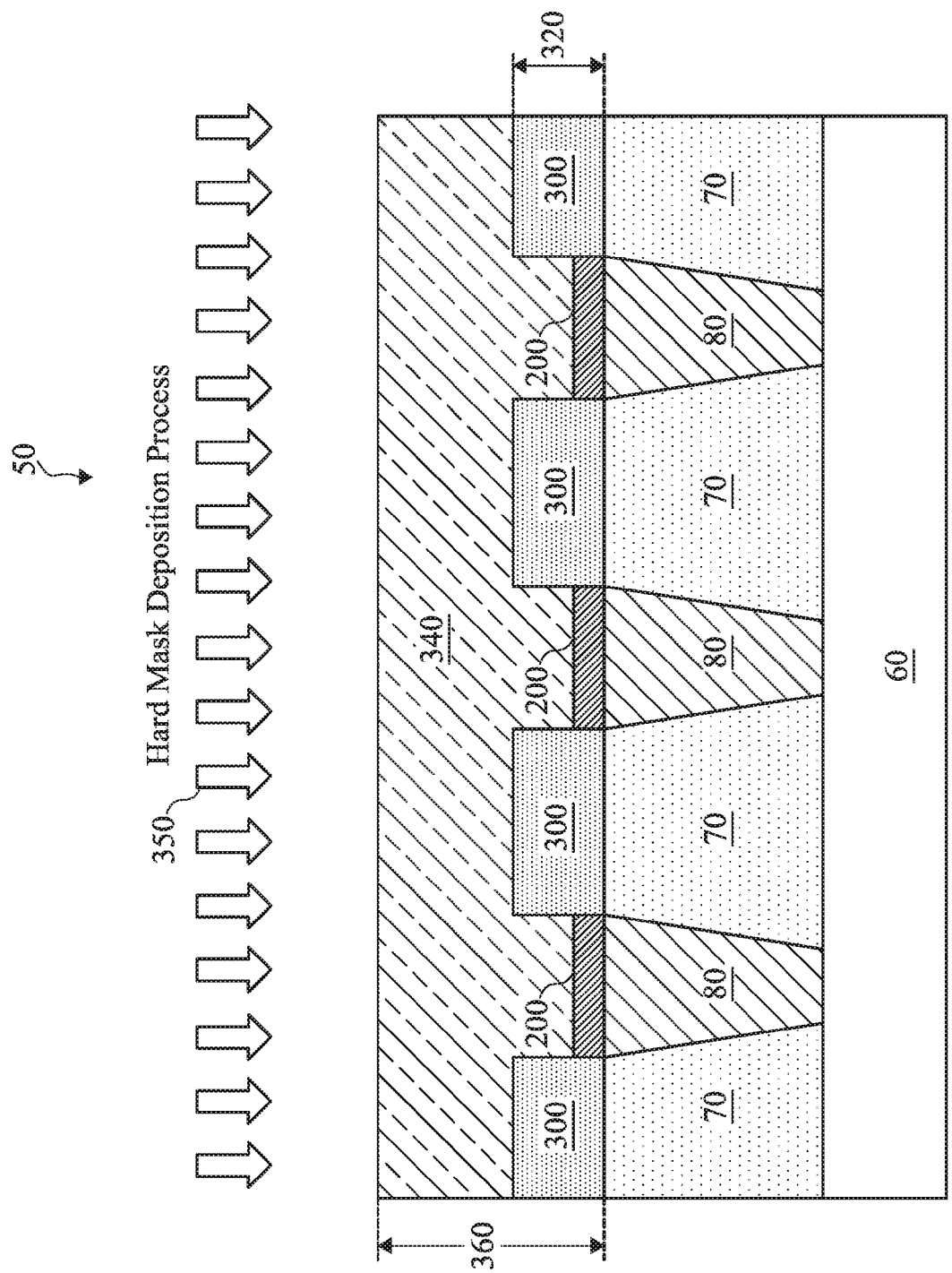

Referring now to FIG. 12, a hard mask layer 340 is formed over the etching stop layer 300 and over the metal capping layers 200, thereby filling the recesses 330. The hard mask layer 340 is formed by a hard mask deposition process 350. In some embodiments, the hard mask deposition process 350 includes a spin-on dielectric process with the following process conditions:

Sol-gel: ethanol/siloxane oligomers
Rotation speed: 1000-4000 revolutions per minute (RPM)
Baking temperature: 80 degrees Celsius-350 degrees Celsius
Ultraviolet (UV) curing: 350 degrees Celsius-400 degrees Celsius, for about 60-120 seconds The hard mask layer 340 has a different material composition than the etching stop layer 300. For example, the hard mask layer 340 may contain silicon oxide, while the etching stop layer 300 may contain hafnium oxide, zirconium oxide, or aluminum oxide. The hard mask layer 340 also is formed to be at least several times thicker than the etching stop layer 300. In some embodiments, a thickness 360 of the hard mask layer 340 is in a range from about 20 nanometers to about 40 nanometers.

Figure 13:
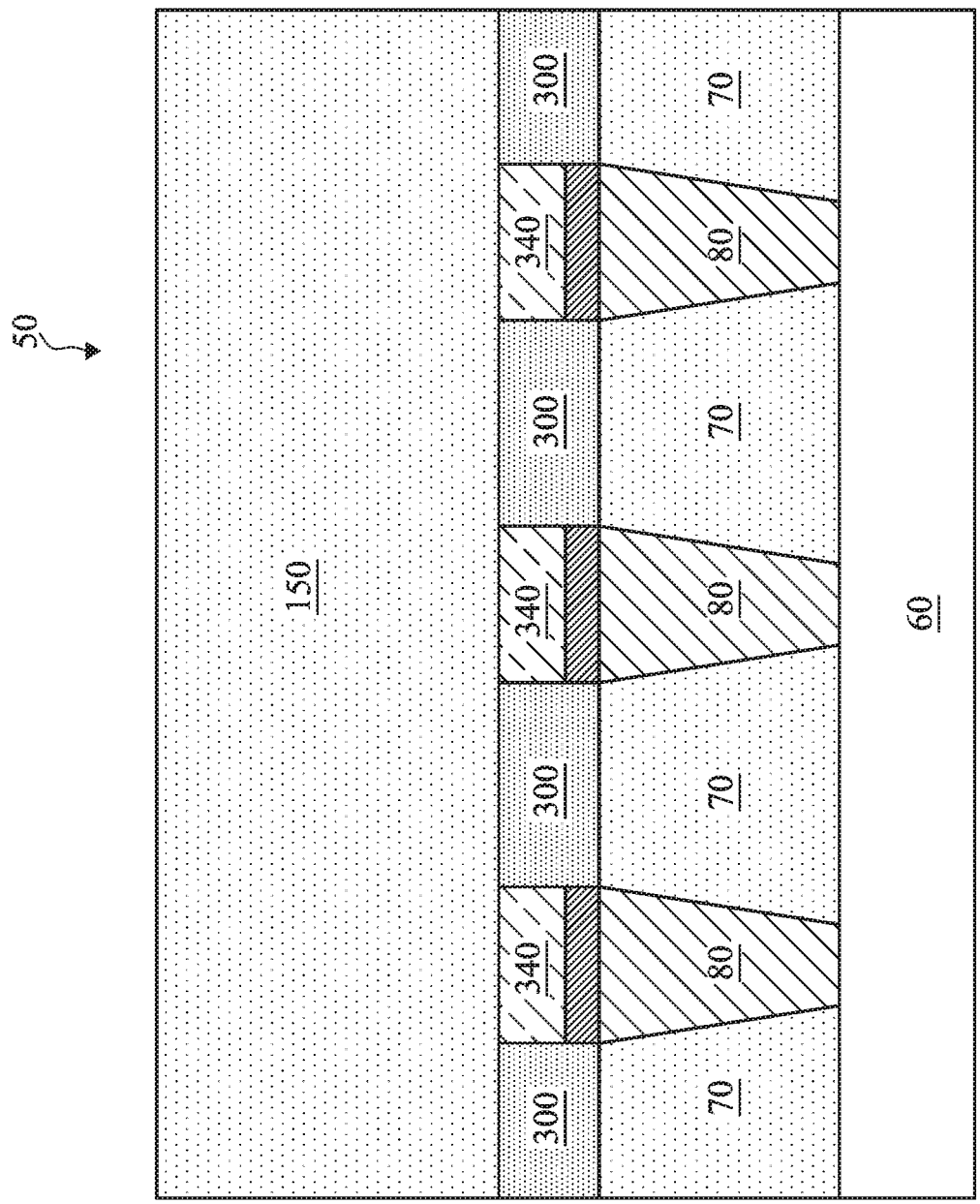

Referring now to FIG. 13, a polishing process (such as a chemical mechanical polishing process) is performed to etch away portions of the hard mask layer 340 until it has a coplanar surface with the etching stop layers 300. Thereafter, a dielectric material 150 is formed on the surfaces of the hard mask layer 340 and on the etching stop layer 300.

Figure 14:
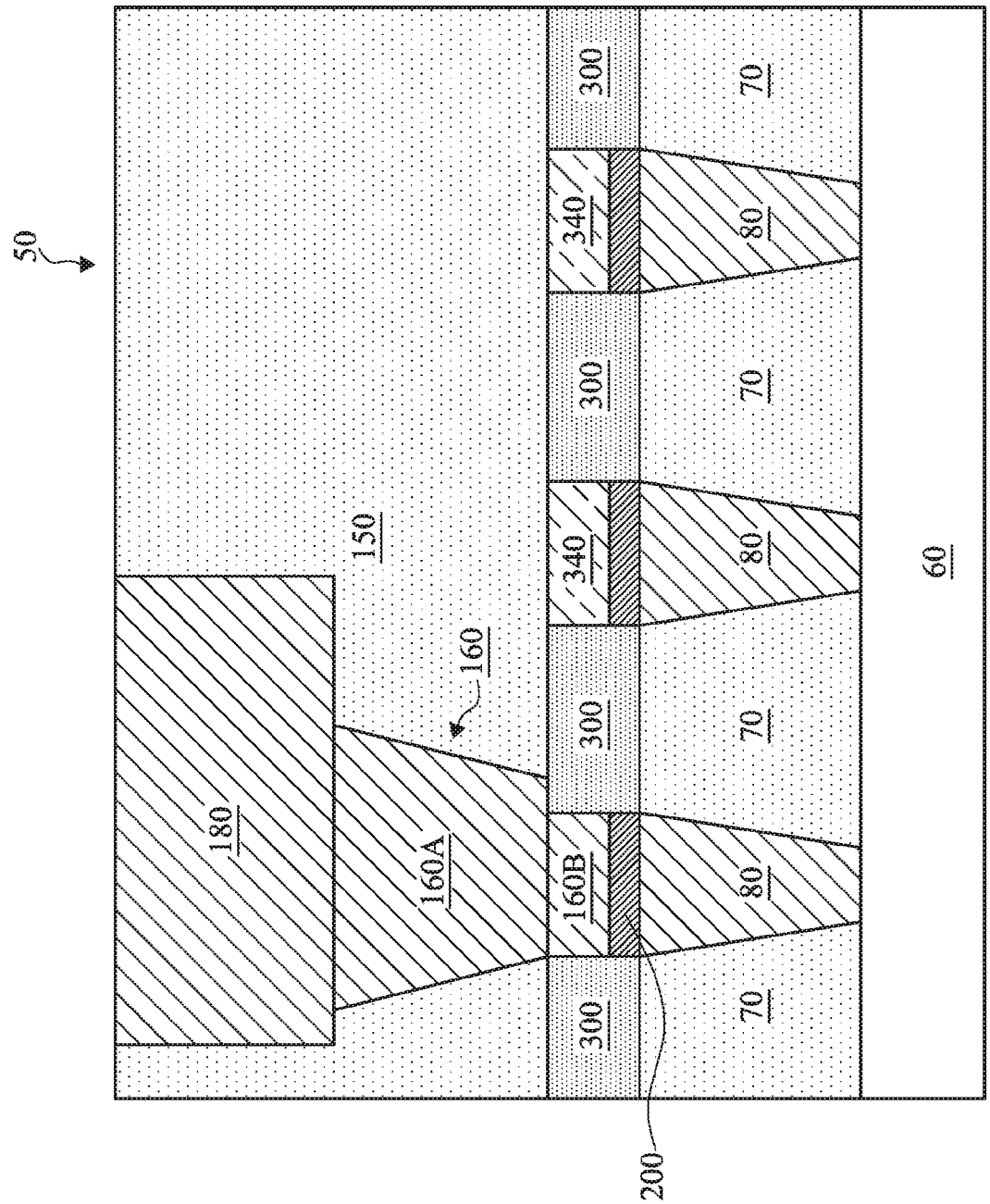

Referring now to FIG. 14, a via 160 and a conductive element 180 (of a $M_{X+1}$ interconnect layer) are formed in the dielectric material 150. The via 160 is formed by performing an etching process to etch an opening in the dielectric material 150, while the hard mask 340 (and also the etching stop layer 300) serves as an etching stop layer. The hard mask 340 is thereafter "opened" in another etching process, while the etching stop layer 300 serves as the etching stop layer to prevent the dielectric layer 70 from being inadvertently over-etched, due to a high etching selectivity (e.g., >100:1) between the hard mask layer 340 and the etching stop layer 300. Alternatively, a single etching process may be performed to etch both the dielectric material 150 and the portion of the hard mask disposed over the conductive element 80. As long as there is sufficient etching selectivity between the etching stop layer 300 and the hard mask layer 340/the dielectric layer 150, the etching stop layer 300 can prevent etching of the dielectric material 70 below.

Thus, after the etched opening is filled, the portion of the hard mask layer 340 disposed above one of the conductive elements 80 is effectively replaced by a segment 160B of the via 160, whereas another segment 160A of the via 160 is disposed in the dielectric material 150. And since the metal capping layer 200 is electrically conductive, the via 160 still electrically interconnects together the conductive elements 80 and 180. In this manner, even though the steps are different, this embodiment shown in FIGS. 10-14 still avoids the "tiger tooth" problems and can offer better gap filling performance, relaxed process windows, and better device performance.

FIG. 15 is a flowchart of a method 500 of fabricating a semiconductor device according to various aspects of the present disclosure. One or more of the steps of the method 500 are performed as a part of a fabrication process for a semiconductor technology node that is a 5-nanometer technology node or smaller.

The method 500 includes a step 510 of forming a first conductive element in a first dielectric material.

The method 500 includes a step 520 of forming, through a selective atomic layer deposition (ALD) process, a first etching stop layer on the first dielectric material but not on the first conductive element.

The method 500 includes a step 530 of forming a second etching stop layer over the first etching stop layer. The second etching stop layer and the first etching stop layer have different material compositions. In some embodiments, the second etching stop layer is formed to be in a range from about 2 nanometers to about 8 nanometers. For example, the second etching stop layer may be 5-10 times thicker than the first etching stop layer. In some embodiments, the material compositions of the first and second etching stop layer are configured such that the first and second etching stop layers have substantially different etching rates. In other words, a high etching selectivity (e.g., greater than 100:1) exists between them. In some embodiments, the first etching stop layer is formed to contain hafnium oxide, zirconium oxide, or aluminum oxide. In some embodiments, the second etching stop layer is formed to contain silicon oxycarbide (SiOC) or silicon oxynitride (SiON).

The method 500 includes a step 540 of forming a second dielectric layer over the second etching stop layer. In some embodiments, both the first dielectric layer and the second dielectric layer contain a low-k dielectric material.

The method 500 includes a step 550 of forming an opening in the second dielectric layer through one or more etching processes, wherein the opening extends through the second etching stop layer but not through the first etching stop layer, and wherein the opening is at least partially aligned with the first conductive element.

The method 500 includes a step 560 of forming a second conductive element over the first conductive element by filling the opening.

It is understood that additional processes may be performed before, during, or after the steps 510-560 of the method 500 to complete the fabrication of the semiconductor device. For example, a third conductive element is over the second conductive element. The first conductive element is a first metal line of a $M_X$ interconnect layer of an interconnect structure. The third conductive element is a second metal line of a $M_{X+1}$ interconnect layer of the interconnect structure. The second conductive element is a via that interconnects the first and third conductive elements together. For reasons of simplicity, additional fabrication steps are not discussed herein in detail.

Based on the above discussions, it can be seen that the present disclosure offers advantages over conventional methods and devices of forming vias. It is understood, however, that other embodiments may offer additional advantages, and not all advantages are necessarily disclosed herein, and that no particular advantage is required for all embodiments. One advantage is that, as discussed above, by forming an extra etching stop layer, the present disclosure can prevent inadvertent over-etching of the ILD layer. As such, the overlay or alignment requirements for the via are relaxed. The via can be made larger, which allows for better gap filling performance as well as reducing a contact resistance. Other advantages are that the present disclosure does not require many changes to the existing method of fabrication. As such, it does not significantly increase fabrication cost, if at all.

One aspect of the present disclosure pertains to a semiconductor device. The semiconductor device includes a first layer of an interconnect structure formed over a substrate. The first layer contains a first dielectric material and a first conductive element disposed in the first dielectric material. The semiconductor device includes a first etching stop layer that is disposed on the first dielectric material of the first layer but not on the first conductive element of the first layer. The semiconductor device includes a second conductive element disposed over the first layer. The second conductive element is at least partially aligned with, and electrically coupled to, the first conductive element.

Another aspect of the present disclosure pertains to a semiconductor device. The semiconductor device includes a $M_X$ interconnect layer of an interconnect structure disposed over a substrate. The $M_X$ interconnect layer contains a first dielectric material and a plurality of first metal lines disposed in the first dielectric material. The semiconductor device includes a first etching stop layer that is disposed on the first dielectric material but not on the first metal lines. The first etching stop layer contains hafnium oxide, zirconium oxide, or aluminum oxide. The semiconductor device includes a second etching stop layer disposed over the first etching stop layer, wherein the second etching stop layer contains silicon oxycarbide (SiOC) or silicon oxynitride (SiON). The semiconductor device includes a $M_{X+1}$ interconnect layer of the interconnect structure disposed over the $M_X$ interconnect layer. The $M_{X+1}$ interconnect layer contains a second dielectric material and a second metal line disposed in the second dielectric material. The semiconductor device includes a via that electrically interconnects at least one of the first metal lines with the second metal line. The via extends through the second etching stop layer but not the first etching stop layer.

Yet another aspect of the present disclosure pertains to a method of fabricating a semiconductor device. A first conductive element is formed in a first dielectric material. Through a selective atomic layer deposition (ALD) process, a first etching stop layer is formed on the first dielectric material but not on the first conductive element. A second conductive element is formed over the first conductive element. The second conductive element is formed to be at least partially aligned with, and electrically coupled to, the first conductive element.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
    a first layer of an interconnect structure formed over a substrate, wherein the first layer contains a first dielectric material and a first conductive element disposed in the first dielectric material;
    a first etching stop layer that is disposed on the first dielectric material of the first layer but not on the first conductive element of the first layer; and
    a second conductive element disposed over the first layer, wherein the second conductive element is at least partially aligned with, and electrically coupled to, the first conductive element;
    a second etching stop layer disposed over the first etching stop layer and over the first layer, wherein the second conductive element extends through the second etching stop layer; and
    a second layer of the interconnect structure disposed over the second etching stop layer, wherein the second layer of the interconnect structure includes a second dielectric material and a third conductive element disposed in the second dielectric material, wherein the third conductive element is disposed over, and electrically coupled to, the second conductive element.

2. The semiconductor device of claim 1, wherein:
    the first layer is a $M_X$ interconnect layer of the interconnect structure;
    the second layer is a $M_{X+1}$ interconnect layer of the interconnect structure;
    the first conductive element is a first metal line of the $M_X$ interconnect layer;
    the third conductive element is a second metal line of the $M_{X+1}$ interconnect layer; and
    the second conductive element is a via that interconnects the first and third conductive elements together.

3. The semiconductor device of claim 1, wherein:
    the first etching stop layer and the second etching stop layer have different material compositions such that an etching selectivity exists between them; and
    the second etching stop layer has a thickness in a range from about 2 nanometers to about 8 nanometers.

4. The semiconductor device of claim 3, wherein:
    the first etching stop layer contains hafnium oxide, zirconium oxide, or aluminum oxide; and
    the second etching stop layer contains silicon oxycarbide (SiOC) or silicon oxynitride (SiON).

5. The semiconductor device of claim 1, wherein no portion of the second conductive element extends below the first etching stop layer.

6. The semiconductor device of claim 1, wherein:
    the first layer contains a plurality of additional first conductive elements separated from one another by the first dielectric material; and
    a metal capping layer is disposed on each of the first conductive elements but not on the first dielectric material.

7. The semiconductor device of claim 6, further comprising a hard mask element disposed on the metal capping layer, wherein:
    the hard mask element and the first etching stop layer have co-planar surfaces; and
    the hard mask element and the first etching stop layer have different material compositions such that an etching selectivity exists between them.

8. A semiconductor device, comprising:
    a $M_X$ interconnect layer of an interconnect structure disposed over a substrate, wherein the $M_X$ interconnect layer contains a first dielectric material and a plurality of first metal lines disposed in the first dielectric material;
    a first etching stop layer that is disposed on the first dielectric material but not on the first metal lines, wherein the first etching stop layer contains hafnium oxide, zirconium oxide, or aluminum oxide;
    a second etching stop layer disposed over the first etching stop layer, wherein the second etching stop layer contains silicon oxycarbide (SiOC) or silicon oxynitride (SiON);
    a $M_{X+1}$ interconnect layer of the interconnect structure disposed over the $M_X$ interconnect layer, wherein the $M_{X+1}$ interconnect layer contains a second dielectric material and a second metal line disposed in the second dielectric material; and
    a via that electrically interconnects at least one of the first metal lines with the second metal line, wherein the via extends through the second etching stop layer but not the first etching stop layer.

9. The semiconductor device of claim 8, wherein the second etching stop layer has a thickness in a range from about 2 nanometers to about 8 nanometers.

10. The semiconductor device of claim 8, further comprising a metal capping layer disposed on each of the first metal lines but not on the first dielectric material.

11. A method of fabricating a semiconductor device, comprising:
    forming a first conductive element in a first dielectric material;

forming, through a selective atomic layer deposition (SALD) process, a first etching stop layer on the first dielectric material but not on the first conductive element;

forming a second etching stop layer over the first etching stop layer, wherein the second etching stop layer and the first etching stop layer have different material compositions;

forming a second dielectric layer over the second etching stop layer;

forming an opening in the second dielectric layer through one or more etching processes, wherein the opening extends through the second etching stop layer but not through the first etching stop layer, and wherein the opening is at least partially aligned with the first conductive element; and forming a second conductive element over the first conductive element, wherein the second conductive element is formed to be at least partially aligned with, and electrically coupled to, the first conductive element.

12. The method of claim 11, wherein:
the second etching stop layer is formed to have a thickness in a range from about 2 nanometers to about 8 nanometers; and
the material compositions of the first and second etching stop layers are configured such that the first and second etching stop layers have substantially different etching rates when the second etching stop layer is etched open by the one or more etching processes.

13. The method of claim 12, wherein:
the first etching stop layer is formed to contain hafnium oxide, zirconium oxide, or aluminum oxide; and
the second etching stop layer is formed to contain silicon oxycarbide (SiOC) or silicon oxynitride (SiON).

14. The method of claim 11, further comprising, forming a third conductive element over the second conductive element;
wherein:
the second conductive element and the third conductive element are formed by filling the opening with a conductive material;
the first conductive element is a first metal line of a $M_X$ interconnect layer of an interconnect structure;
the third conductive element is a second metal line of a $M_{X+1}$ interconnect layer of the interconnect structure; and
the second conductive element is a via that interconnects the first and third conductive elements together.

15. The method of claim 11, wherein:
the forming of the first conductive element comprise forming a plurality of additional first conductive elements that are separated from one another by the first dielectric material; and
further comprising forming a plurality of metal capping layers on the first conductive elements, respectively, but not on the first dielectric material.

16. The method of claim 15, wherein the first etching stop layer is formed to be thicker than the metal capping layer; and further comprising:
forming a plurality of hard mask elements on the metal capping layers, respectively, the hard mask elements and the first etching stop layer having different material compositions.

17. The method of claim 16, wherein the hard mask elements are formed at least in part using a spin-on dielectric deposition process followed by an ultraviolet curing process.

18. The method of claim 16, wherein the forming of the second conductive element comprises etching through one of the hard mask elements to form an opening and filling the opening with a metal material, and wherein the first etching stop layer and the hard mask elements have different etching rates when one of the hard mask elements being is etched.

19. The method of claim 11, wherein the SALD process comprises a plurality of alternating first and second cycles in which a precursor gas is turned on in the first cycle and an oxidant gas is turned on for the second cycle, and wherein the precursor gas include Tetrakisethylmethylaminohafnium (TEMAHf), Tetrakis(ethylmethylamido)zirconium (TEMA-Zr), Trimethyl Aluminum (TMA), or Tetrakis(dimethylamido) Aluminum (TDMAA).

20. The method of claim 11, wherein the SALD process is performed at a process temperature range from about 200 degrees Celsius to about 400 degrees Celsius.

* * * * *